(12) United States Patent
Imada

(10) Patent No.: US 9,190,507 B2
(45) Date of Patent: Nov. 17, 2015

(54) SEMICONDUCTOR DEVICE

(71) Applicant: FUJITSU LIMITED, Kawasaki-shi, Kanagawa (JP)

(72) Inventor: Tadahiro Imada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/705,548

(22) Filed: Dec. 5, 2012

(65) Prior Publication Data

US 2013/0092952 A1    Apr. 18, 2013

Related U.S. Application Data

(63) Continuation of application No. PCT/JP2010/060728, filed on Jun. 24, 2010.

(51) Int. Cl.

| | | |
|---|---|---|
| *H01L 29/778* | (2006.01) | |
| *H01L 29/66* | (2006.01) | |
| *H01L 29/872* | (2006.01) | |
| H01L 27/02 | (2006.01) | |
| H01L 27/085 | (2006.01) | |
| H01L 29/20 | (2006.01) | |
| H01L 29/417 | (2006.01) | |

(52) U.S. Cl.
CPC ...... *H01L 29/7787* (2013.01); *H01L 29/66462* (2013.01); *H01L 29/7786* (2013.01); *H01L 29/872* (2013.01); *H01L 27/0207* (2013.01); *H01L 27/085* (2013.01); *H01L 29/2003* (2013.01); *H01L 29/41758* (2013.01)

(58) Field of Classification Search
USPC ...................................... 257/76, 133, E29.242
See application file for complete search history.

(56) References Cited

U.S. PATENT DOCUMENTS

| | | | |
|---|---|---|---|
| 5,151,757 A   * | 9/1992 | Enoki et al. ................... | 257/194 |
| 2003/0098462 A1 | 5/2003 | Yoshida | |
| 2004/0201038 A1 | 10/2004 | Kimura et al. | |
| 2007/0026552 A1 | 2/2007 | Kimura et al. | |
| 2007/0228477 A1 * | 10/2007 | Suzuki et al. ................. | 257/368 |
| 2008/0315257 A1 | 12/2008 | Shiraishi | |

(Continued)

FOREIGN PATENT DOCUMENTS

| | | |
|---|---|---|
| JP | 57-030374 | 2/1982 |
| JP | 62-002646 | 1/1987 |

(Continued)

OTHER PUBLICATIONS

International Search Report for International Application No. PCT/JP2010/060728 dated Sep. 14, 2010.

(Continued)

*Primary Examiner* — Fernando L Toledo
*Assistant Examiner* — Lawrence-Linh T Nguyen
(74) *Attorney, Agent, or Firm* — Kratz, Quintos & Hanson, LLP

(57) ABSTRACT

A transistor which includes an electron transit layer and an electron supply layer which are stacked in a thickness direction of a substrate; an electron transit layer formed over the substrate in parallel to the electron transit layer and the electron supply layer; an anode electrode which forms a Schottky junction with the electron transit layer; and a cathode electrode which forms an ohmic junction with the electron transit layer are provided. The anode electrode is connected to a source of the transistor, and the cathode electrode is connected to a drain of the transistor.

13 Claims, 9 Drawing Sheets

(56) References Cited

U.S. PATENT DOCUMENTS

| | | |
|---|---|---|
| 2009/0166677 A1 | 7/2009 | Shibata |
| 2009/0206363 A1* | 8/2009 | Machida et al. ............. 257/133 |
| 2010/0155781 A1 | 6/2010 | Suzuki |
| 2011/0227132 A1* | 9/2011 | Anda et al. ................... 257/192 |

FOREIGN PATENT DOCUMENTS

| | | |
|---|---|---|
| JP | 2003-229566 A1 | 8/2003 |
| JP | 2004-228481 | 8/2004 |
| JP | 2005-26242 A1 | 1/2005 |
| JP | 2007-035905 | 2/2007 |
| JP | 2007-266475 A1 | 10/2007 |
| JP | 2007-273795 A1 | 10/2007 |
| JP | 2009-4398 A1 | 1/2009 |
| JP | 2009-164158 A1 | 7/2009 |

OTHER PUBLICATIONS

International Preliminary Examination Report mailed Jan. 24, 2013 in counterpart application No. PCT/JP2010/060728.

Japanese Office Action dated Feb. 13, 2014, in the counterpart Japanese patent application No. 2012-521225.

Office action dated Feb. 17, 2015, in counterpart CN application 201080067573.6.

Office Action of Japanese Patent Application No. 2012-521225, dated Nov. 4, 2014.

Partial English Translation of Office Action of Japanese Patent Application No. 2012-521225, dated Feb. 18, 2014.

* cited by examiner

SEMICONDUCTOR DEVICE

CROSS-REFERENCE TO RELATED APPLICATION

This application is a continuation application of International Application PCT/JP2010/060728 filed on Jun. 24, 2010 and designated the U.S., the entire contents of which are incorporated herein by reference.

FIELD

The embodiments discussed herein relate to a semiconductor device.

BACKGROUND

Conventionally, studies have been conducted on a high electron mobility transistor (HEMT) having an AlGaN layer and a GaN layer formed by crystal growth over a substrate, in which the GaN layer functions as an electron transit layer. The band gap of GaN is 3.4 eV, which is wider than the band gap of Si (1.1 eV) and the band gap of GaAs (1.4 eV). Accordingly, the GaN-based HEMT has high breakdown voltage, and is promising as a high breakdown voltage power device for automobiles or the like.

A body diode exists inevitably in an Si-based field effect transistor. The body diode is connected to a transistor to be in inversely parallel to the transistor, and functions as a free wheel diode in a full-bridge circuit method used for a high-power power supply. However, in the GaN-based HEMT, such a body diode does not exist inevitably. Accordingly, there has been proposed a structure in which a pn junction diode, which has a p-type layer and an n-type layer stacked in a thickness direction of the substrate, is connected to the GaN-based HEMT.

However, in the structure which has been proposed, a delay easily occurs in operation of the diode. Then, accompanying the delay, inverse electric current flows in the HEMT before the diode operates as the free wheel diode, and the power consumption increases. Further, when overvoltage is applied between the source and the drain of the HEMT due to the delay, the diode does not operate as a protective circuit.

Patent Literature 1: Japanese Laid-open Patent Publication No. 2009-164158

Patent Literature 2: Japanese Laid-open Patent Publication No. 2009-4398

SUMMARY

According to an aspect of the embodiments, a semiconductor device includes: a substrate; a transistor that comprises a first electron transit layer and an electron supply layer which are stacked in a thickness direction of the substrate; a second electron transit layer formed over the substrate in parallel to the first electron transit layer and the electron supply layer; an anode electrode that forms a Schottky junction with the second electron transit layer; and a cathode electrode that forms an ohmic junction with the second electron transit layer. The anode electrode is connected to a source of the transistor, and the cathode electrode is connected to a drain of the transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described specifically with reference to the attached drawings.

First Embodiment

Figure 1A:
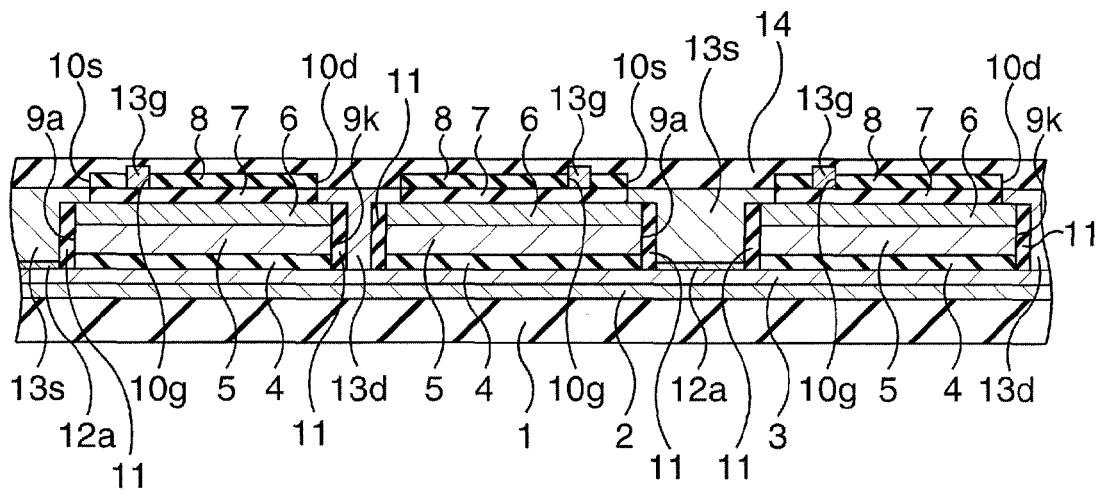
FIG. 1A is a cross-sectional view illustrating a structure of a semiconductor device according to a first embodiment.
Figure 1B:
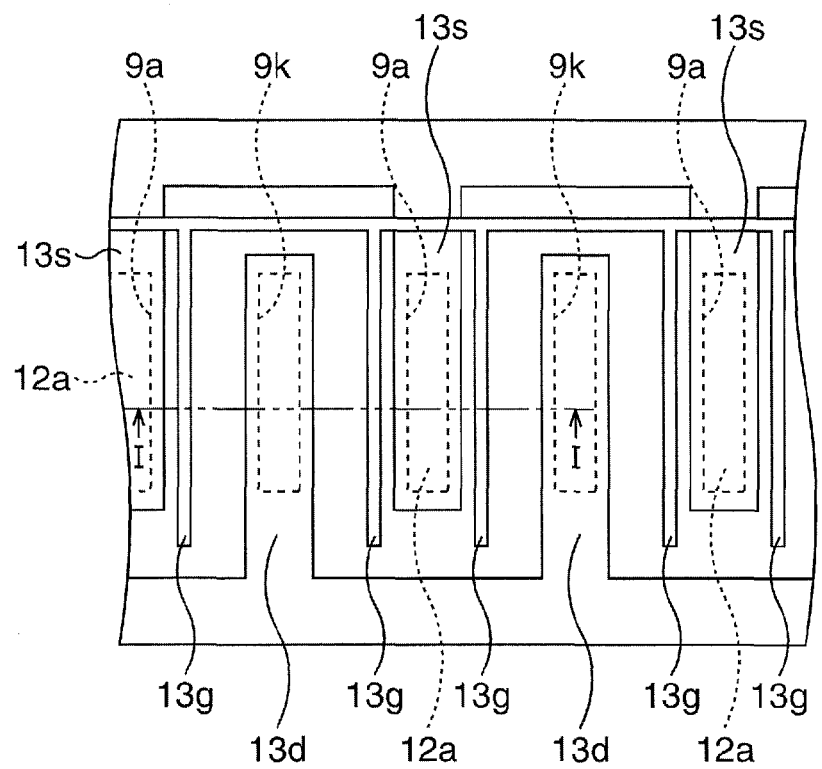
FIG. 1B is a plan view illustrating a positional relation of electrodes in the first embodiment.
Figure 2:
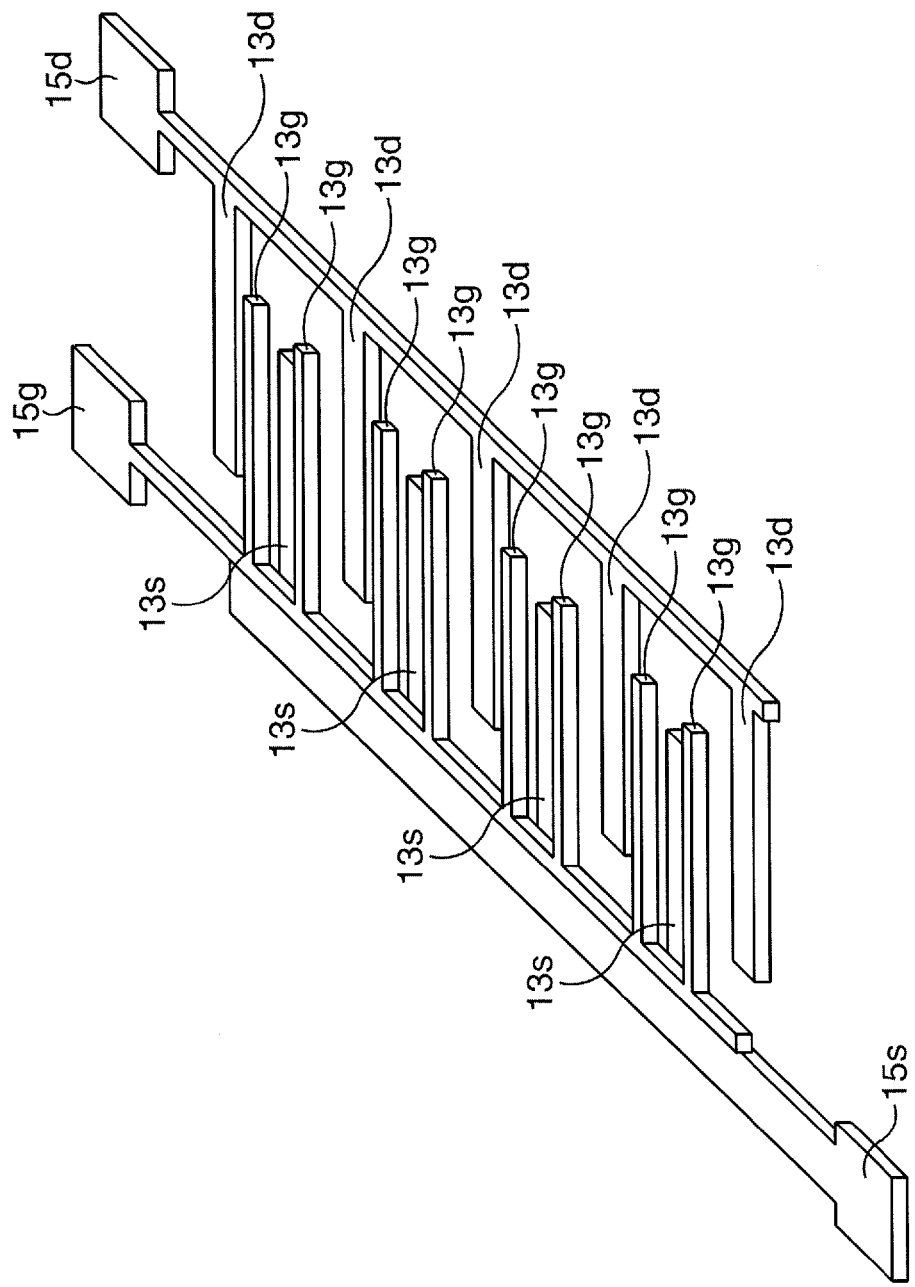
FIG. 2 is a schematic diagram three-dimensionally illustrating the positional relation of electrodes.

First, a first embodiment will be described. FIG. 1A is a cross-sectional view illustrating a structure of a semiconductor device according to the first embodiment. FIG. 1B is a plan view illustrating a positional relation of electrodes in the first embodiment. Further, FIG. 2 is a schematic diagram three-dimensionally illustrating the positional relation of electrodes. Note that FIG. 1A illustrates a cross section taken along a line I-I in FIG. 1B.

In the first embodiment, as illustrated in FIG. 1A, a buffer layer 2, an electron transit layer 3 (second electron transit layer), an insulating layer 4, an electron transit layer 5 (first electron transit layer), an electron supply layer 6, a cap layer 7, and an insulating layer 8 are formed in this order over a substrate 1. The substrate 1 is an n-type Si substrate, for example. As the buffer layer 2, for example, an AlN layer is formed, which has a thickness of 1 nm to 1000 nm, for example. As the electron transit layer 3, for example, a GaN layer is formed, which has a thickness of 10 nm to 5000 nm, for example. As the insulating layer 4, for example, an AlN layer is formed, which has a thickness of 10 nm to 5000 nm for example. As the electron transit layer 5, for example, a GaN layer is formed, which has a thickness of 10 nm to 5000 nm, for example. As the electron supply layer 6, for example, an $AlO_{0.25}Ga_{0.75}N$ layer is formed, which has a thickness of 1 nm to 100 nm, for example. As the cap layer 7, for example, an n-type GaN layer is formed, which has a thickness of 1 nm to 100 nm, for example. Si is doped to the cap layer 7, for example. As the insulating layer 8, for example, a silicon nitride layer is formed.

An opening 10g for a gate electrode is formed in the insulating layer 8, and an opening 10s for a source electrode and an opening 10d for a drain electrode are formed in the insulating layer 8 and the cap layer 7. Further, an opening 9a for an anode electrode and an opening 9k for a cathode electrode are formed in the electron supply layer 6, the electron transit layer 5, and the insulating layer 4. The opening 9a is connected to the opening 10s, and the opening 9k is connected to the opening 10d. Further, an insulating layer 11 which covers the electron supply layer 6, the electron transit layer 5, and the insulating layer 4 is formed on side faces of the opening 9a and the opening 9k. As the insulating layer 11, for example, an AlN layer is formed. The opening 10g is located closer to the opening 10s side than the opening 10d.

In a bottom portion of the opening 9a, an anode electrode 12a in Schottky contact with the electron transit layer 3 is formed. As the anode electrode 12a, for example, a stacked body of a Ni film in contact with the electron transit layer 3 and a Au film located thereon is formed. Further, a source electrode 13s located on the anode electrode 12a and in ohmic contact with the electron supply layer 6 is formed in the opening 9a and the opening 10s. As the source electrode 13s, for example, a stacked body of a Ta film in contact with the anode electrode 12a and the electron supply layer 6, and an Al film located thereon is formed. Moreover, a cathode-drain electrode 13d in ohmic contact with the electron transit layer 3 and the electron supply layer 6 is formed in the opening 9k and the opening 10d. As the cathode-drain electrode 13d, for example, a stacked body of a Ta film in contact with the electron transit layer 3 and the electron supply layer 6, and an Al film located thereon is formed. In the opening 10g, a gate electrode 13g is formed. As the gate electrode 13g, for example, a stacked body of a Ni film in contact with the cap layer 7 and a Au film located thereon is formed.

Then, a surface protection layer 14 which covers the gate electrode 13g, the source electrode 13s, and the cathode-drain electrode 13d is formed over the insulating layer 8. As the surface protection layer 14, for example, a silicon nitride layer is formed. As illustrated in FIG. 1B and FIG. 2, the gate electrode 13g, the source electrode 13s, and the cathode-drain electrode 13d are disposed in a comb shape. Then, the gate electrode 13g is connected to a gate pad 15g, the source electrode 13s is connected to a source pad 15s, and the cathode-drain electrode 13d is connected to a drain pad 15d. Further, in the surface protection layer 14, openings which expose the gate pad 15g, the source pad 15s, and the drain pad 15d, respectively, are formed.

In the first embodiment structured thus, a GaN-based HEMT exists, which includes the gate electrode 13g, the source electrode 13s, the cathode-drain electrode 13d, the electron supply layer 6, and the electron transit layer 5. Further, a Schottky barrier diode also exists, which includes the anode electrode 12a, the cathode-drain electrode 13d, and the electron transit layer 3, and is connected in inversely parallel to the HEMT. Then, when negative voltage is applied to the cathode-drain electrode 13d, electrons move from the cathode-drain electrode 13d to the anode electrode 12a via the electron transit layer 3, and electric current flows toward the cathode-drain electrode 13d from the anode electrode 12a. That is, the Schottky barrier diode functions as a free wheel diode. The cathode electrode of the Schottky barrier diode is integrated with the drain electrode of the HEMT, and the anode electrode is in direct contact with the source electrode. Therefore, the Schottky barrier diode operates before large electric current flows through the HEMT, which suppresses increase in power consumption. Further, when large positive voltage is applied to the cathode-drain electrode 13d, electrons move from the anode electrode 12a to the cathode-drain electrode 13d via the electron transit layer 3, and electric current flows toward the anode electrode 12a from the cathode-drain electrode 13d. That is, the Schottky barrier diode functions as a protective diode. Therefore, failure of the HEMT can be prevented.

Next, a method of manufacturing the semiconductor device according to the first embodiment will be described. FIG. 3A to FIG. 3E are cross-sectional views illustrating the method of manufacturing the semiconductor device according to the first embodiment in the order of steps.

Figure 3A:
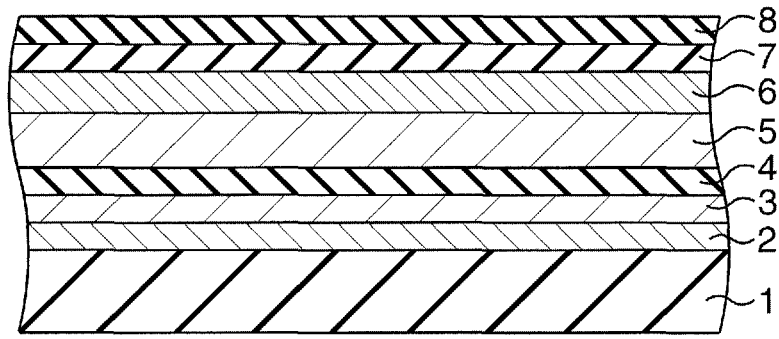
FIG. 3A to FIG. 3E are cross-sectional views illustrating a method of manufacturing the semiconductor device according to the first embodiment in the order of steps.

First, as illustrated in FIG. 3A, the buffer layer 2, the electron transit layer 3, the insulating layer 4, the electron transit layer 5, the electron supply layer 6, and the cap layer 7 are formed in this order over the substrate 1 by a metal organic chemical vapor deposition (MOCVD) method, for example.

Figure 4:
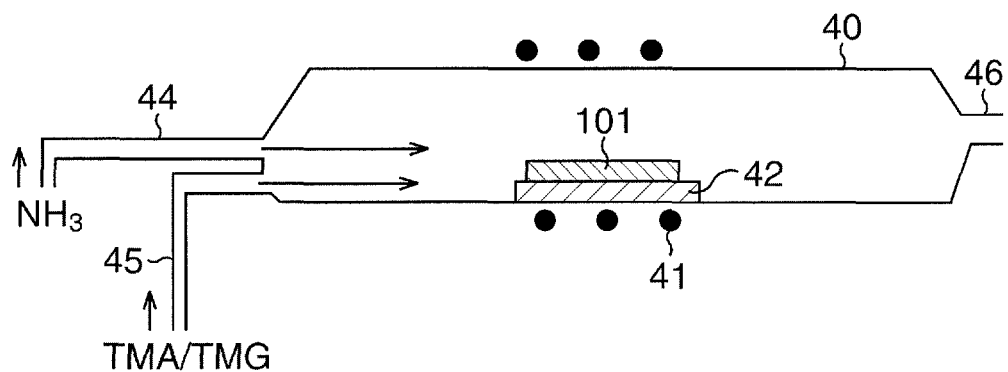
FIG. 4 is a diagram illustrating a structure of an MOCVD apparatus.

Here, an MOCVD apparatus will be described. FIG. 4 is a diagram illustrating a structure of an MOCVD apparatus. A high-frequency coil 41 is disposed around a reaction tube 40 made of quartz, and a carbon susceptor 42 that mounts a substrate 101 is disposed inside the reaction tube 40. Two gas introduction tubes 44 and 45 are connected on an upstream end (end portion on the left side in FIG. 4) of the reaction tube 40, through which a source gas of chemical compound is supplied. For example, an $NH_3$ gas is introduced as an N source gas from the gas introduction tube 44, and an organic group III chemical compound raw material such as a trimethyl aluminum (TMA), trimethyl gallium (TMG), or the like is introduced as a source gas of group III element from the gas introduction tube 45. Crystal growth is performed on the substrate 101, and excess gasses are exhausted to a detoxifying tower from a gas exhaust tube 46. Note that when the crystal growth by the MOCVD method is performed in a reduced pressure atmosphere, the gas exhaust tube 46 is connected to a vacuum pump, and an exhaust port of the vacuum pump is connected to the detoxifying tower.

Conditions for forming the $Al_{0.25}Ga_{0.75}N$ layer as the electron supply layer 6 are set for example as:

flow rate of trimethyl gallium (TMG): 0 to 50 sccm,
flow rate of trimethyl aluminum (TMA): 0 to 50 sccm,
flow rate of ammonium ($NH_3$): 20 slm,
pressure: 100 Torr, and
temperature: 1100° C.

After the cap layer 7 is formed, the insulating layer 8 is formed over the cap layer 7. The insulating layer 8 is formed by a plasma CVD method, for example.

Figure 3B:
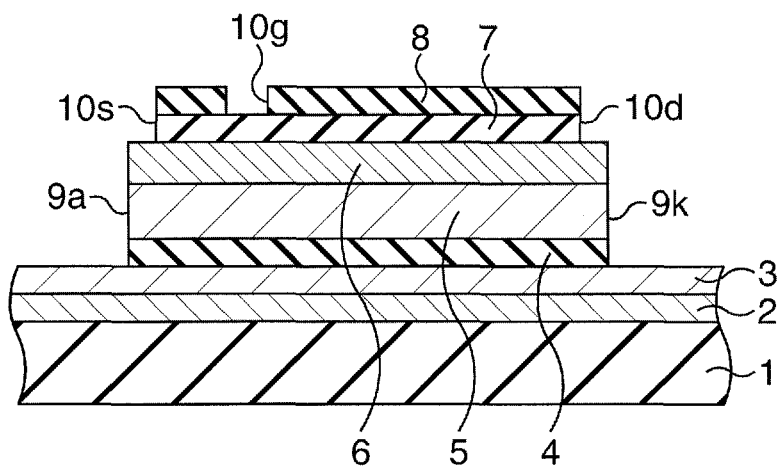

Next, as illustrated in FIG. 3B, the opening 10g, the opening for a source electrode, and the opening for a drain electrode are formed in the insulating layer 8. In formation of these openings, for example, selective etching using $SF_6$ gas is performed with a resist pattern being a mask. After these openings are formed, the openings 10s and 10d are formed in the cap layer 7. In formation of the openings 10s and 10d, for example, selective etching using a $Cl_2$ gas is performed with a resist pattern being a mask. After the openings 10s and 10d are formed, openings 9a and 9k are formed. In formation of the openings 9a and 9k, for example, selective etching using the $Cl_2$ gas is performed with a resist pattern being a mask.

Figure 3C:
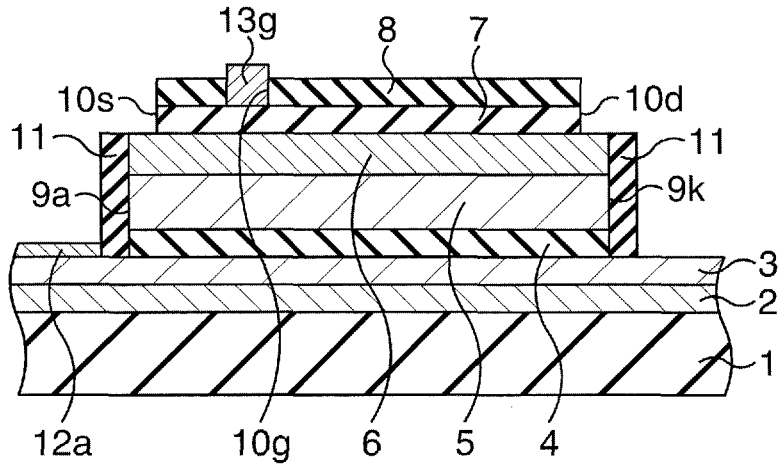

Thereafter, as illustrated in FIG. 3C, the insulating layer 11 is formed on side faces of the openings 9a and 9k, the gate electrode 13g is formed in the opening 10g, and the anode electrode 12a is formed in a bottom part of the opening 9a. The insulating layer 11 is formed before the anode electrode 12a is formed. Regarding the gate electrode 13g and the anode electrode 12a, one of them may be formed first, or the both of them may be formed simultaneously. The gate electrode 13g and the anode electrode 12a may be formed by a lift-off method, for example.

Figure 3D:
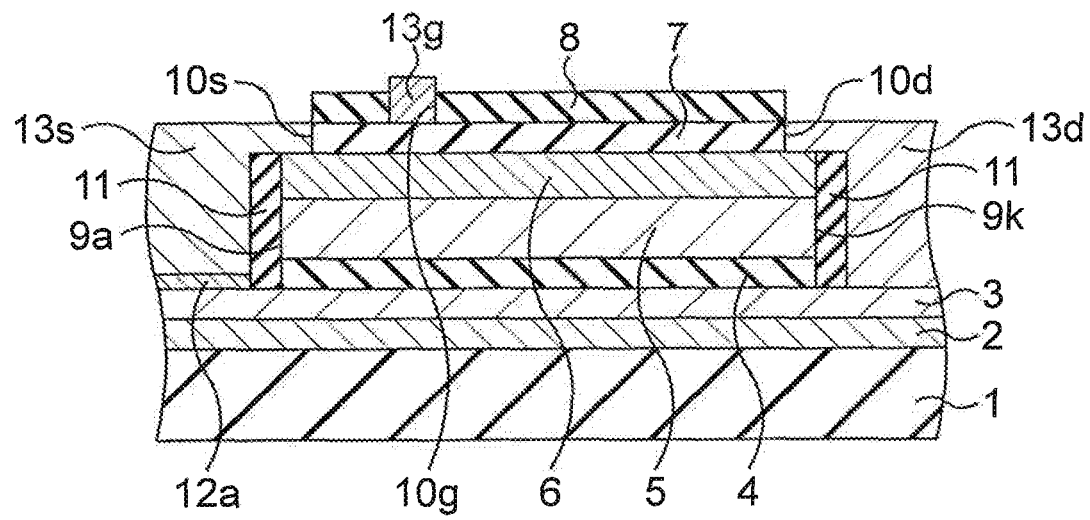

Subsequently, as illustrated in FIG. 3D, the source electrode 13s is formed in the openings 9a and 10s, and the cathode-drain electrode 13d is formed in the openings 9k and 10d. Regarding the source electrode 13s and the cathode-drain electrode 13d, one of them may be formed first, or the both of them may be formed simultaneously. The source electrode 13s and the cathode-drain electrode 13d may be formed by a lift-off method, for example.

Figure 3E:
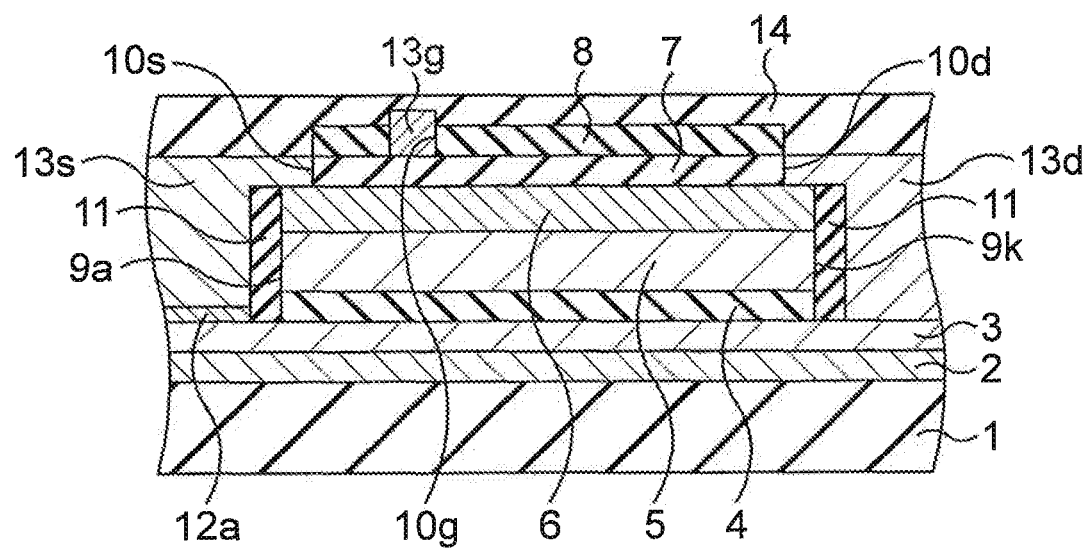

Next, as illustrated in FIG. 3E, the surface protection layer 14 which covers the gate electrode 13g, the source electrode 13s, and the cathode-drain electrode 13d is formed over the insulating layer 8. The surface protection layer 14 may be formed by a plasma CVD method, for example.

Thereafter, the back surface of the substrate is polished as necessary to make the substrate have a predetermined thickness. Further, the opening exposing the gate pad, the opening exposing the source pad, and the opening exposing the drain pad are formed in the surface protection layer 14.

Thus, the semiconductor device according to the first embodiment can be completed.

Second Embodiment

Figure 5A:
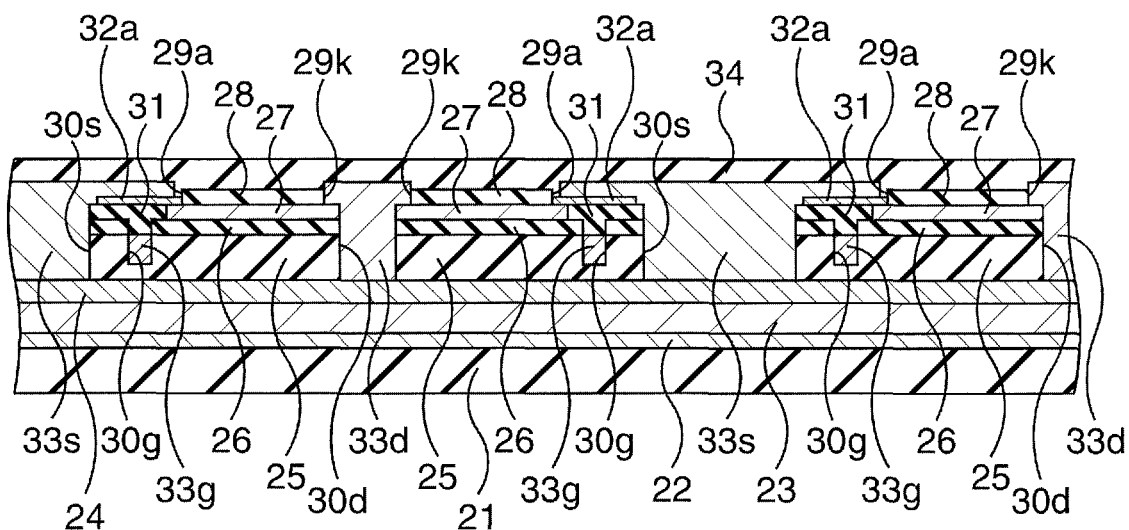
FIG. 5A is a cross-sectional view illustrating a structure of a semiconductor device according to a second embodiment.
Figure 5B:
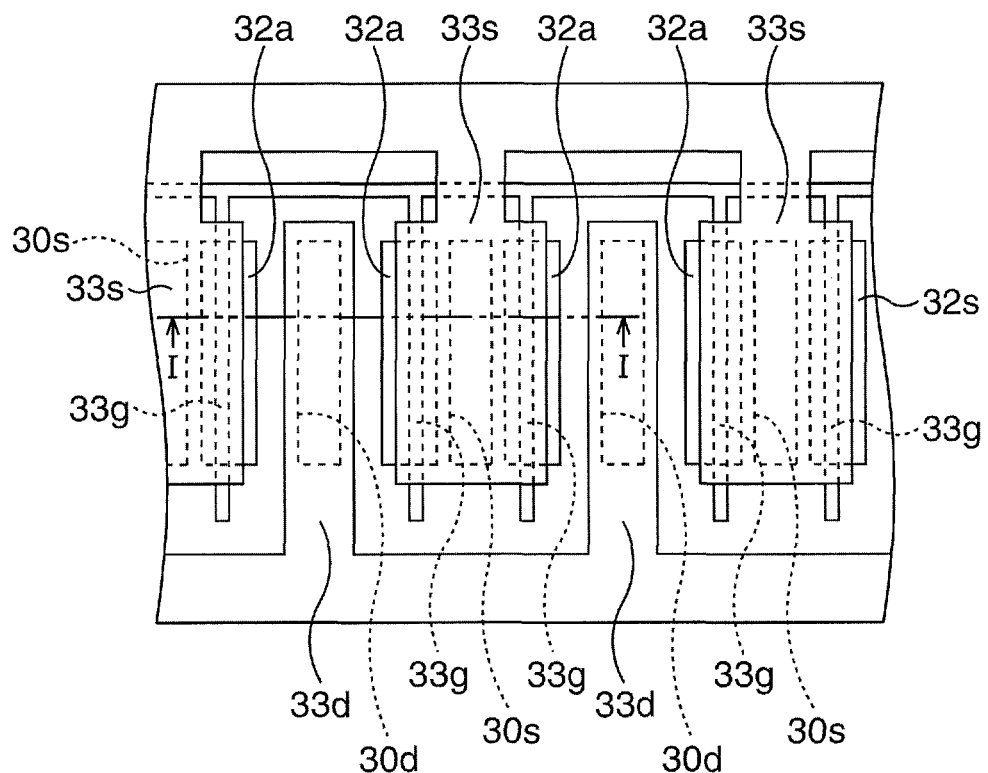
FIG. 5B is a plan view illustrating a positional relation of electrodes in the second embodiment.

First, a second embodiment will be described. FIG. 5A is a cross-sectional view illustrating a structure of a semiconductor device according to the second embodiment, and FIG. 5B is a plan view illustrating a positional relation of electrodes in the second embodiment. Note that FIG. 5A illustrates a cross section taken along a line I-I in FIG. 5B.

In the second embodiment, as illustrated in FIG. 5A, a buffer layer 22, an electron transit layer 23 (first electron transit layer), an electron supply layer 24, a cap layer 25, an insulating layer 26, an electron transit layer 27 (second electron transit layer), and an insulating layer 28 are formed in this order over a substrate 21. The substrate 21 is an n-type Si substrate, for example. As the buffer layer 22, for example, an AlN layer is formed, which has a thickness of 1 nm to 1000 nm, for example. As the electron transit layer 23, for example, a GaN layer is formed, which has a thickness of 10 nm to 5000 nm, for example. As the electron supply layer 24, for example, an $Al_{0.25}Ga_{0.75}N$ layer is formed, which has a thickness of 1 nm to 100 nm, for example. As the cap layer 25, for example, an n-type GaN layer is formed, which has a thickness of 1 nm to 100 nm, for example. Si is doped to the cap layer 25, for example. As the insulating layer 26, for example, an AlN layer is formed, which has a thickness of 10 nm to 5000 nm, for example. As the electron transit layer 27, for example, a GaN layer is formed, which has a thickness of 10 nm to 5000 nm, for example. As the insulating layer 28, for example, a silicon nitride layer is formed.

An opening 30s for a source electrode, an opening 30d for a drain electrode, an opening 29a for an anode electrode, and an opening 29k for a cathode electrode are formed in the insulating layer 28. The opening 30s and the opening 30d are also formed in the electron transit layer 27, the insulating layer 26, and the cap layer 25. The opening 30s and the opening 29a are connected to each other, and it is not necessary to make the boundary therebetween clear. Similarly, the opening 30d and the opening 29k are connected to each other, and it is not necessary to make the boundary therebetween clear. Moreover, a recess 30g for a gate electrode is formed in the cap layer 25. The recess 30g is located closer to the opening 30s side than the opening 30d.

A gate electrode 33g is formed in the recess 30g. As the gate electrode 33g, for example, a stacked body of a Ni film located in a bottom portion of the recess 30g and a Au film located thereon is formed. At a position matching with the recess 30g in plan view in the electron transit layer 27 and the insulating layer 26, an opening connected to the opening 29a and the opening 30s is formed, and an insulating layer 31 which covers the gate electrode 33g is formed in this opening. As the insulating layer 31, for example, an AlN layer is formed. In the opening 29a and on the insulating layer 31, an anode electrode 32a in Schottky contact with the electron transit layer 27 is formed. As the anode electrode 32a, for example, a stacked body of a Ni film in contact with the electron transit layer 27 and a Au film located thereon is formed. Further, in the opening 29a and the opening 30s, a source electrode 33s in contact with the anode electrode 32a and in ohmic contact with the electron supply layer 24 is formed. As the source electrode 33s, for example, a stacked body of a Ta film in contact with the anode electrode 32a and the electron supply layer 24, and an Al film located thereon is formed. Moreover, in the opening 29k and the opening 30d, a cathode-drain electrode 33d in ohmic contact with the electron transit layer 27 and the electron supply layer 24 is formed. As the cathode-drain electrode 33d, for example, a stacked body of a Ta film in contact with the electron transit layer 27 and the electron supply layer 24, and an Al film located thereon is formed.

Then, a surface protection layer 34 which covers the source electrode 33s and the cathode-drain electrode 33d is formed over the insulating layer 2. As the surface protection layer 34, for example, a silicon nitride layer is formed. As illustrated in FIG. 5B, the gate electrode 33g, the source electrode 33s, and the cathode-drain electrode 33d are disposed in a comb shape. Then, similarly to the first embodiment, the gate electrode 33g is connected to a gate pad, the source electrode 33s is connected to a source pad, and the cathode-drain electrode 33d is connected to a drain pad. Further, in the surface protection layer 34, the openings which expose the gate pad, the source pad, and the drain pad, respectively, are formed.

In the second embodiment structured thus, a GaN-based HEMT exists, which includes the gate electrode 33g, the source electrode 33s, the cathode-drain electrode 33d, the electron supply layer 24, and the electron transit layer 23. Further, a Schottky barrier diode also exists, which includes the anode electrode 32a, the cathode-drain electrode 33d, and the electron transit layer 27, and is connected in inversely parallel to the HEMT. Then, when negative voltage is applied to the cathode-drain electrode 33d, electrons move from the cathode-drain electrode 33d to the anode electrode 32a via the electron transit layer 27, and electric current flows toward the cathode-drain electrode 33d from the anode electrode 32a. That is, the Schottky barrier diode functions as a free wheel diode. The cathode electrode of the Schottky barrier diode is integrated with the drain electrode of the HEMT, and the anode electrode is in direct contact with the source electrode. Therefore, the Schottky barrier diode operates before large electric current flows through the HEMT, which suppresses increase in power consumption. Further, when large positive voltage is applied to the cathode-drain electrode 33d, electrons move from the anode electrode 32a to the cathode-drain electrode 33d via the electron transit layer 27, and electric current flows toward the anode electrode 32a from the cathode-drain electrode 33d. That is, the Schottky barrier diode functions as a protective diode. Therefore, failure of the HEMT can be prevented.

In general, when semiconductor layers are stacked, a trap is formed in the semiconductor layer located on the surface. Then, the trap may become a factor for decreasing characteristics of the HEMT. However, in the second embodiment, since the semiconductor layer which forms the Schottky barrier diode is formed on the HEMT, it is difficult for a trap to be formed in the semiconductor layers in the HEMT. Therefore, an HEMT with more favorable characteristics can be obtained.

Next, a method of manufacturing the semiconductor device according to the second embodiment will be described. FIG. 6A to FIG. 6E are cross-sectional views illustrating the method of manufacturing the semiconductor device according to the second embodiment in the order of steps.

Figure 6A:
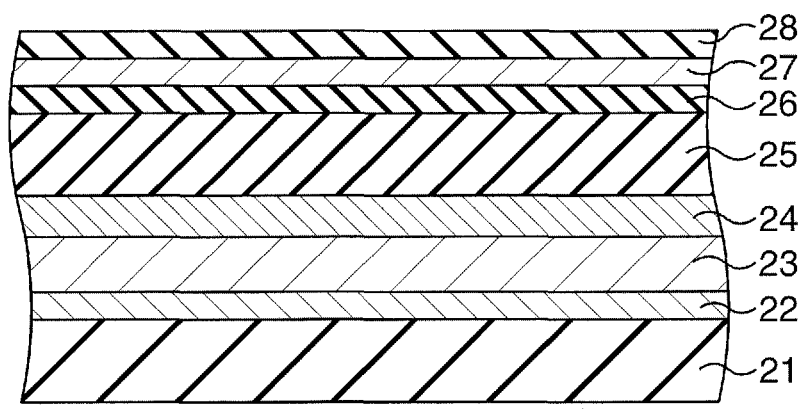
FIG. 6A to FIG. 6E are cross-sectional views illustrating a method of manufacturing the semiconductor device according to the second embodiment in the order of steps.

First, as illustrated in FIG. 6A, the buffer layer 22, the electron transit layer 23, the electron supply layer 24, the cap layer 25, the insulating layer 26, and the electron transit layer 27 are formed in this order over the substrate 21 by an MOCVD method, for example. Then, the insulating layer 28 is formed over the electron transit layer 27. The insulating layer 28 may be formed by a plasma CVD method, for example.

Figure 6B:
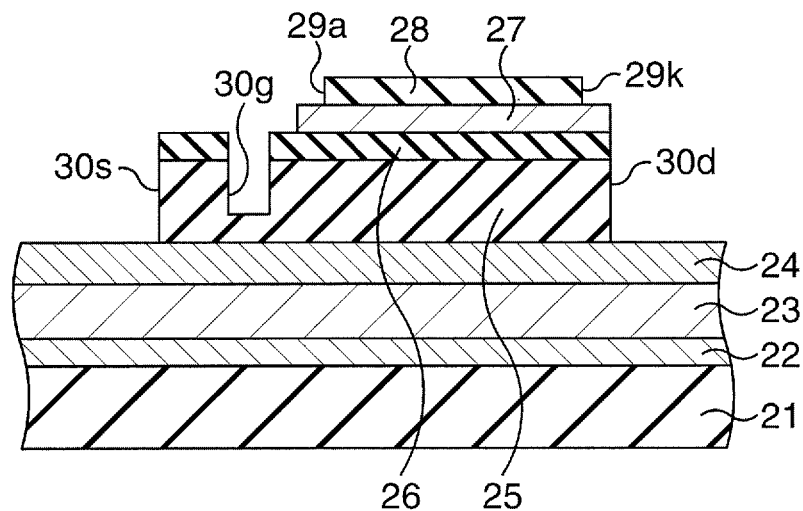

Next, as illustrated in FIG. 6B, the openings 30s, 30d, 29a, and 29k are formed in the insulating layer 28. In formation of the openings 30s, 30d, 29a, and 29k, for example, selective etching using $SF_6$ gas is performed with a resist pattern being a mask. After the openings 30s, 30d, 29a, and 29k are formed, the openings 30g, 30s, and 30d are formed. At this time, an opening connected to the opening 30g is formed in the electron transit layer 27 and the insulating layer 26. In formation of these openings, for example, selective etching using the $Cl_2$ gas is performed with a resist pattern being a mask.

Figure 6C:
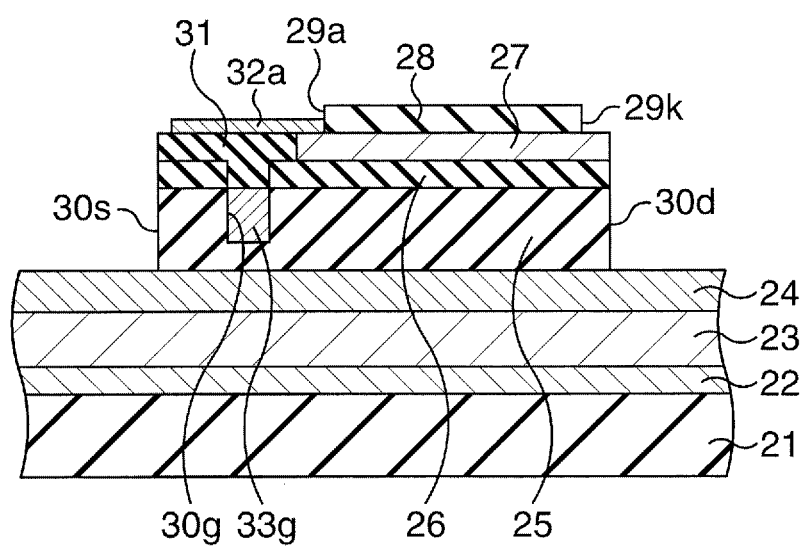

Thereafter, as illustrated in FIG. 6C, the gate electrode 33g is formed in the recess 30g. Subsequently, the insulating layer 31 is formed over the gate electrode 33g. Then, the anode electrode 32a is formed over insulating layer 31. The gate electrode 33g and the anode electrode 32a may be formed by a lift-off method, for example.

Figure 6D:
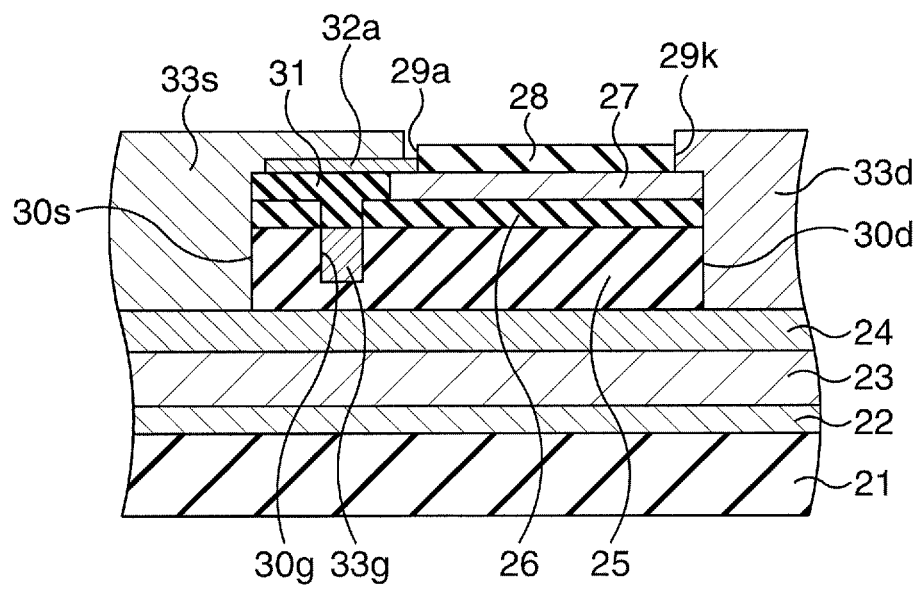

Thereafter, as illustrated in FIG. 6D, the source electrode 33s is formed in the openings 29a and 30s, and the cathode-drain electrode 33d is formed in the openings 29k and 30d. Regarding the source electrode 33s and the cathode-drain electrode 33d, one of them may be formed first, or the both of them may be formed simultaneously. The source electrode 33s and the cathode-drain electrode 33d may be formed by a lift-off method, for example.

Figure 6E:
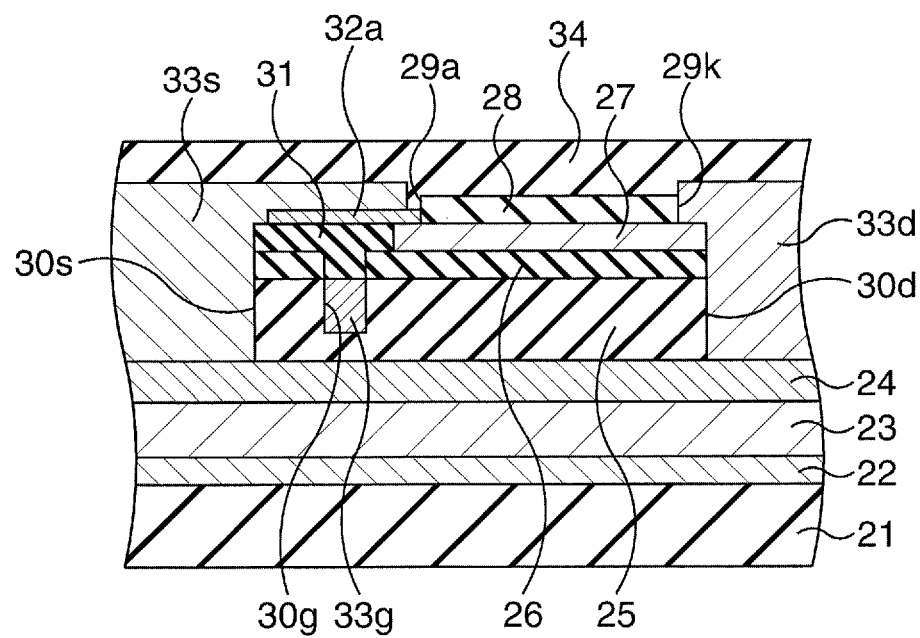

Next, as illustrated in FIG. 6E, the surface protection layer 34 which covers the source electrode 33s and the cathode-drain electrode 33d is formed over the insulating layer 28. The surface protection layer 34 may be formed by a plasma CVD method, for example.

Thereafter, the back surface of the substrate is polished as necessary to make the substrate have a predetermined thickness. Further, the opening exposing the gate pad, the opening exposing the source pad, and the opening exposing the drain pad are formed in the surface protection layer 34.

Thus, the semiconductor device according to the second embodiment can be completed.

Note that the materials, thicknesses, impurity concentrations and so on of the substrate and the respective layers are not particularly limited. For example, as the substrate, a sapphire substrate, a SiC substrate, a GaN substrate, or the like may be used instead of the Si substrate. As the electron transit layer included in the Schottky barrier diode, one including a p-type or n-type semiconductor may be used, or one including at least two types of semiconductors which have different lattice constants from each other such as GaN or AlGaN may be used. Moreover, as the insulating layer which insulates the electron transit layer included in the Schottky barrier diode and the HEMT from each other, one containing at least one of AlN, AlGaN, p-type GaN, Fe doped GaN, Si oxide, Al oxide, Si nitride, or C may be used. Further, as the material for the anode electrode in Schottky contact with the electron transit layer, there are Ni, Pd, and Pt, which may be used in combination.

Figure 7A:
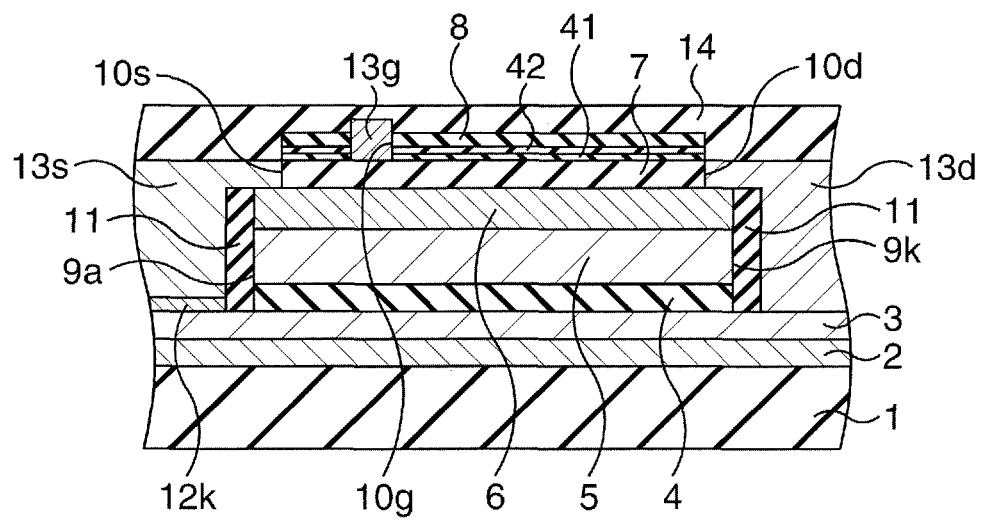
FIG. 7A is a cross-sectional view illustrating a modification example of the first embodiment.
Figure 7B:
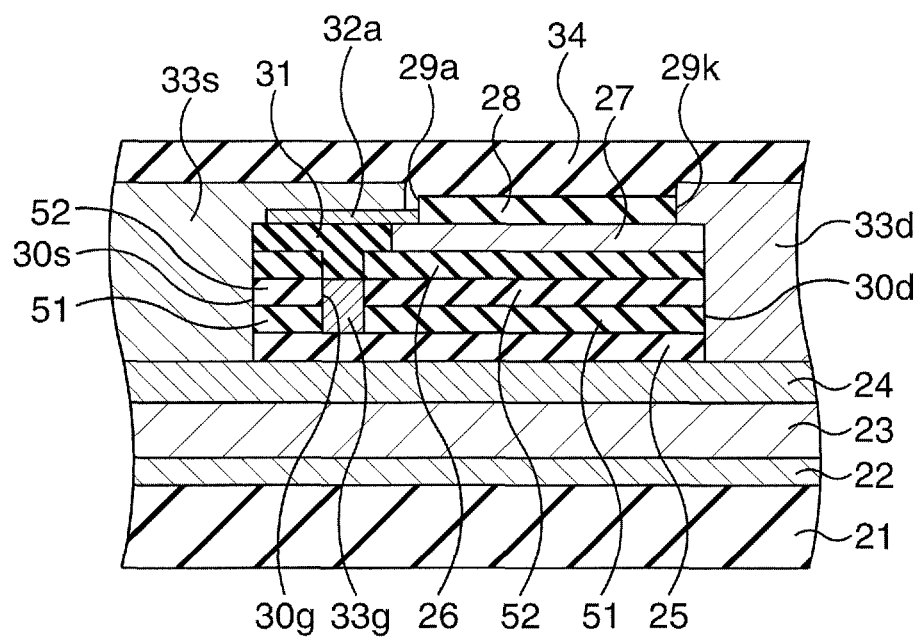
FIG. 7B is a cross-sectional view illustrating a modification example of the second embodiment.

Further, as illustrated in FIG. 7A, an insulating layer 41 of AlN or AlGaN and an n-type GaN layer 42 may be stacked over the cap layer 7 of n-type GaN in the first embodiment. Similarly, as illustrated in FIG. 7B, the cap layer 25 of n-type GaN may be located below the gate electrode 33g, and an insulating layer 51 of AlN or AlGaN and an n-type GaN layer 52 may be stacked over the cap layer 25.

These semiconductor devices may be used for a switching semiconductor element for example. Further, such a switching element may also be used for a switching power supply or electronic equipment. Moreover, it is possible to use these semiconductor devices as a part for a full-bridge power supply circuit such as a power supply circuit of a server.

These semiconductor devices and the like enable a diode connected to a transistor to operate properly.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A semiconductor device, comprising:
   a substrate;
   a transistor that comprises a first electron transit layer and an electron supply layer which are stacked in a thickness direction of the substrate;
   a second electron transit layer formed over the substrate in parallel to the first electron transit layer and the electron supply layer;
   an insulating layer that insulates the transistor and the second electron transit layer from each other, the insulating layer being between the first electron transit layer and the second electron transit layer in the thickness direction of the substrate;
   an anode electrode that forms a Schottky junction with the second electron transit layer; and
   a cathode electrode that forms an ohmic junction with the second electron transit layer, wherein
   the anode electrode is connected to a source of the transistor, and
   the cathode electrode is connected to a drain of the transistor.

2. The semiconductor device according to claim 1, wherein the transistor comprises an n-type gallium nitride layer formed over the electron supply layer.

3. The semiconductor device according to claim 2, wherein the transistor comprises:
   a second insulating layer formed on the n-type gallium nitride layer and made of an aluminum nitride or an aluminum gallium nitride; and
   a second n-type gallium nitride layer formed on the second insulating layer.

4. The semiconductor device according to claim 1, wherein the second electron transit layer is located between the substrate and the transistor.

5. The semiconductor device according to claim 1, wherein the second electron transit layer contains a p-type or n-type semiconductor.

6. The semiconductor device according to claim 1, wherein the second electron transit layer contains at least two types of semiconductors which have different lattice constants from each other.

7. The semiconductor device according to claim 1, wherein the second electron transit layer contains a gallium nitride or an aluminum gallium nitride.

8. The semiconductor device according to claim 1, wherein the insulating layer contains at least one selected from the group consisting of aluminum nitride, aluminum gallium nitride, p-type gallium nitride, iron doped gallium nitride, silicon oxide, aluminum oxide, silicon nitride, aluminum oxide, silicon nitride, and carbon.

9. The semiconductor device according to claim 1, wherein the anode electrode contains at least one selected from the group consisting of nickel, palladium, and platinum.

10. A semiconductor device, comprising:
   a substrate;
   a buffer layer formed over the substrate;
   a second electron transit layer formed over the buffer layer;
   an insulating layer formed over the second electron transit layer;
   a first electron transit layer formed over the insulating layer;
   an electron supply layer formed over the first electron transit layer; and
   a cap layer formed over the electron supply layer.

11. The semiconductor device according to claim 10, wherein
   an opening for a source electrode and an anode electrode that reaches the second electron transit layer is formed in the cap layer, the electron supply layer, the first electron transit layer, and the insulating layer,
   an opening for a drain electrode and a cathode electrode that reaches the second electron transit layer is formed in the cap layer, the electron supply layer, the first electron transit layer, and the insulating layer,
   an anode electrode that forms a Schottky junction with the second electron transit layer is formed in the opening for a source electrode and an anode electrode,
   a cathode electrode which forms an ohmic junction with the second electron transit layer is formed in the opening for a drain electrode and a cathode electrode,
   the anode electrode is connected to the electron supply layer;
   the cathode electrode is connected to the electron supply layer, and
   a gate electrode is formed over the electron supply layer between the anode electrode and the cathode electrode.

12. The semiconductor device according to claim 10, further comprising an n-type gallium nitride layer formed over the electron supply layer.

13. The semiconductor device according to claim 12, further comprising:
   a second insulating layer formed over the n-type gallium nitride layer and made of an aluminum nitride or an aluminum gallium nitride; and
   a second n-type gallium nitride layer formed on the second insulating layer.

* * * * *